(12) United States Patent
Leng et al.

(10) Patent No.: US 11,360,915 B2
(45) Date of Patent: Jun. 14, 2022

(54) DATA TRANSMISSION APPARATUSES, DATA PROCESSING SYSTEMS AND METHODS

(71) Applicant: BEIJING BAIDU NETCOM SCIENCE AND TECHNOLOGY CO., LTD., Beijing (CN)

(72) Inventors: Xianglun Leng, Beijing (CN); Ningyi Xu, Beijing (CN); Yang Yan, Beijing (CN); Zhengze Qiu, Beijing (CN); Wei Qi, Beijing (CN)

(73) Assignee: KUNLUNXIN TECHNOLOGY (BEIJING) COMPANY LIMITED, Beijing (CN)

( * ) Notice: Subject to any disclaimer, the term of this patent is extended or adjusted under 35 U.S.C. 154(b) by 0 days.

(21) Appl. No.: 16/904,856

(22) Filed: Jun. 18, 2020

(65) Prior Publication Data
US 2020/0409876 A1   Dec. 31, 2020

(30) Foreign Application Priority Data

Jun. 26, 2019   (CN) .......................... 201910559188.6

(51) Int. Cl.
*G06F 3/06* (2006.01)
*G06F 13/16* (2006.01)
*H04L 41/0896* (2022.01)

(52) U.S. Cl.
CPC .......... *G06F 13/1647* (2013.01); *G06F 3/067* (2013.01); *G06F 3/0613* (2013.01);
(Continued)

(58) Field of Classification Search
CPC ............. G06F 13/1647; G06F 13/1678; G06F 2213/0038; G06F 3/0613; G06F 3/0659; G06F 3/067; H04L 41/0896
See application file for complete search history.

(56) References Cited

U.S. PATENT DOCUMENTS

| | | | | |
|---|---|---|---|---|
| 2004/0156361 A1* | 8/2004 | Shimizu | .................. | H04L 47/50 370/428 |
| 2009/0006775 A1* | 1/2009 | Bartley | ............... | G06F 13/1684 711/E12.001 |

(Continued)

FOREIGN PATENT DOCUMENTS

| | | |
|---|---|---|
| CN | 109313609 A | 2/2019 |
| EP | 1542369 A1 | 6/2005 |

(Continued)

OTHER PUBLICATIONS

Search Report for European application No. 20165433.2, dated Nov. 27, 2020, 8 pages.

(Continued)

*Primary Examiner* — Tracy A Warren
(74) *Attorney, Agent, or Firm* — Fay Sharpe LLP (57) ABSTRACT

According to embodiments of the present disclosure, there is provided a data transmission apparatus. The data transmission apparatus includes a plurality of first ports, a plurality of second ports, and a plurality of data channels. The plurality of first ports are coupled to a processing unit. The plurality of second ports are coupled to a plurality of memories. The plurality of data channels are disposed among the first ports and the second ports to form an interleaving network having a plurality of layers, and configured to transmit data among the processing unit and the plurality of memories, such that each layer in the interleaving network includes at least one interleaving sub-network.

20 Claims, 5 Drawing Sheets

(52) U.S. Cl.
CPC ........ *G06F 3/0659* (2013.01); *G06F 13/1678* (2013.01); *H04L 41/0896* (2013.01); *G06F 2213/0038* (2013.01)

(56) References Cited

U.S. PATENT DOCUMENTS

| | | | |
|---|---|---|---|
| 2014/0164720 A1* | 6/2014 | Stewart | ............... G06F 13/1647 711/157 |
| 2016/0283112 A1 | 9/2016 | Blankenship | |
| 2017/0371812 A1 | 12/2017 | Chun | |

FOREIGN PATENT DOCUMENTS

| | | |
|---|---|---|
| EP | 3480745 A1 | 5/2019 |
| JP | H11338768 A | 12/1999 |
| JP | 2015537317 A | 12/2015 |
| WO | 2018004902 A1 | 1/2018 |

OTHER PUBLICATIONS

Office Action for Japanese Application No. 2020-108977, dated Jun. 8, 2021, 8 pages.

\* cited by examiner

DATA TRANSMISSION APPARATUSES, DATA PROCESSING SYSTEMS AND METHODS

CROSS-REFERENCE TO RELATED APPLICATION

This application claims a priority to and benefits of Chinese Patent Application No. 201910559188.6 filed with the China National Intellectual Property Administration on Jun. 26, 2019, the entire content of which is incorporated herein by reference.

FIELD

Embodiments of the present disclosure mainly relate to a field of data transmission technologies, and more particularly to a data transmission apparatus, a data processing system, and a data processing method.

BACKGROUND

Presently, with the widespread application of artificial intelligence (AI) technologies, a hashrate of a graphic processing unit (GPU) or an AI specific chip is continuously improving. Therefore, bandwidth requirements for memory access are getting higher. For example, 512 GB/s~1 TB/s has become very common, and some chips have exceeded 1 TB/s. However, limited by a process and a timing, it is impossible to increase indefinitely a frequency and a bus width of a system on chip (SoC). Presently, for a common advanced eXtensible interface (AXI), a frequency is about 1 GHz, a data bit width is less than 1024 bits, a common data bit width is 512 bits, and a bandwidth is 64 GB/s (=1 GHz*512 bits/8), which is equivalent to a bandwidth provided by a single-channel memory such as a GDDR (graphics double data rate) memory and a HBM (High Bandwidth Memory). An existing multi-channel and interleaving technology for the memory usually needs 16 (=1 TB/64 GB) AXI interfaces to provide an enough bandwidth for the memory, to meet the bandwidth requirements for memory access.

However, the multi-channel and interleaving for the memory, especially more than 8 channels, also has a great challenge. On one hand, the plurality of channels are difficult to be distributed on one side of the SoC, and often need to be placed on both sides of the SoC or even around the SoC, which brings a great difficulty to a planar layout and physical implementation for the SoC. On the other hand, with the plurality of channels, a great challenge is also brought to a network on chip (NoC) and a system performance of the SoC, including how to access a module that does not support interleaving into the system, and carefully evaluating whether a performance bandwidth under different scenes may meet a requirement of the system.

SUMMARY

In a first aspect of the present disclosure, a data transmission apparatus is provided. The apparatus includes: a plurality of first ports, a plurality of second ports, and a plurality of data channels. The plurality of first ports are coupled to a processing unit. The plurality of second ports are coupled to a plurality of memories. The plurality of data channels are disposed among the first ports and the second ports to form an interleaving network having a plurality of layers, and configured to transmit data among the processing unit and the plurality of memories, such that each layer in the interleaving network includes at least one interleaving sub-network.

In a second aspect of the present disclosure, a data processing method is provided. The data processing method includes: in response to receiving a read request for data in at least one memory in a plurality of memories, obtaining the data from the at least one memory by the data transmission apparatus according to the first aspect of the present disclosure.

In a third aspect of the present disclosure, a data processing method is provided. The data processing method includes: in response to receiving a write request for writing data to at least one memory in a plurality of memories, writing the data into the at least one memory by the data transmission apparatus according to the first aspect of the present disclosure.

In a fourth aspect of the present disclosure, a data processing system is provided. The data processing system includes a processing unit, a data transmission apparatus according to the first aspect of the present disclosure, and a storage device. The storage device is configured to store one or more programs. When the one or more programs are executed by the processing unit, the processing unit is caused to implement the method according to the second aspect and the third aspect of the present disclosure.

In a fifth aspect of the present disclosure, a computer readable storage medium having computer readable instructions stored thereon, is provided. The method according to the second aspect or the third aspect of the present disclosure is implemented when the computer readable instructions are executed.

It should be understood that, descriptions in Summary of the present disclosure are not intended to limit an essential or important feature in embodiments of the present disclosure, and are also not construed to limit the scope of the present disclosure. Other features of the present disclosure will be easily understood by following descriptions.

BRIEF DESCRIPTION OF THE DRAWINGS

The above and other features, advantages and aspects of respective embodiments of the present disclosure will become more apparent with reference to accompanying drawings and following detailed illustrations. In the accompanying drawings, the same or similar numeral references represent the same or similar elements, in which.

DETAILED DESCRIPTION

Description will be made in detail below to embodiments of the present disclosure with reference to accompanying drawings. Some embodiments of the present disclosure are illustrated in the accompanying drawings. It should be understood that, embodiments of the present disclosure may be implemented by various ways, but not be construed as a limitation of the embodiments herein.

On the contrary; those embodiments provided are merely for a more thorough and complete understanding of the present disclosure. It should be understood that, the accompanying drawings and embodiments of the present disclosure are merely for exemplary purposes, but is not meant to limit the protection scope of the present disclosure.

In the description of embodiments of the present disclosure, the terms "includes" and its equivalents like should be understood as an open "include", that is, "include but not limited to". The terms "based on" should be understood as "based at least in part (at least partially based on or at least part based on)". The terms "an embodiment" or "the embodiment" should be understood as "at least one embodiment". The terms "first", "second" and the like may represent different or same objects. Other explicit and implicit definitions may also be included below.

Figure 1:
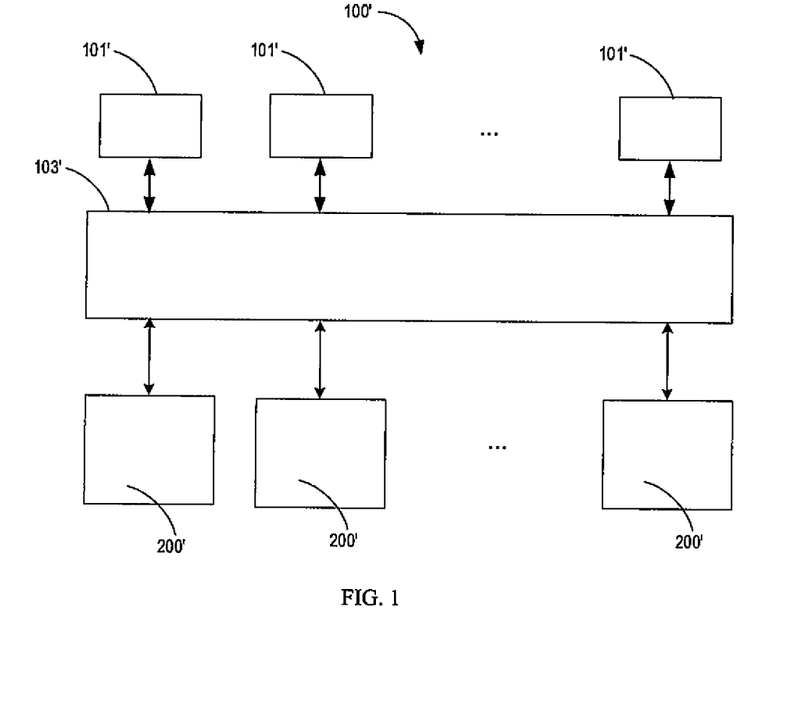
FIG. 1 is a schematic diagram illustrating performing data transmission by utilizing a memory interleaving technology in the related art.

A memory interleaving technology is a technology used to improve performance of a memory, and may provide more transmission channels and a higher bandwidth of the memory, such that the memory may simultaneously perform a plurality of write/read operations at the same time, thereby effectively improving system performance. FIG. 1 is a schematic diagram illustrating performing data transmission by utilizing a memory interleaving technology in the related art. Taking a system-on-chip (SoC) as an example, as illustrated in FIG. 1, for memory interleaving of a plurality of channels (especially more than 8 channels), a control terminal and the memory are usually interconnected by employing an N×N crossbar.

A processing unit 101' of the SoC is generally interconnected with a memory 200' via an interleaved data channel 103', a memory controller and a physical layer (PHY). According to requirement for a chip layout of the SoC, when the memory controller and the physical layer need to be distributed on two or more sides of the SoC, a multi-channel crossbar is hard to be implemented for a common AI chip with 500 mm$^2$.

In particular, when the common AI chip with such size is implemented by employing a symmetric structure and being divided into a plurality of blocks, a module division and the symmetric structure are hard to be implemented, which may be mainly caused by a fact that there is one layer in the multi-channel interleaving network in the related art According to the above technical problems, there is provided a data transmission technology based on a multi-channel and layered interleaving network, to solve or at least partially solve the above problems and/or other potential problems. The data transmission technology may be embodied as a data transmission apparatus. Such data transmission apparatus may be a module applied to any appropriate scene (such as the SoC).

Figure 2:
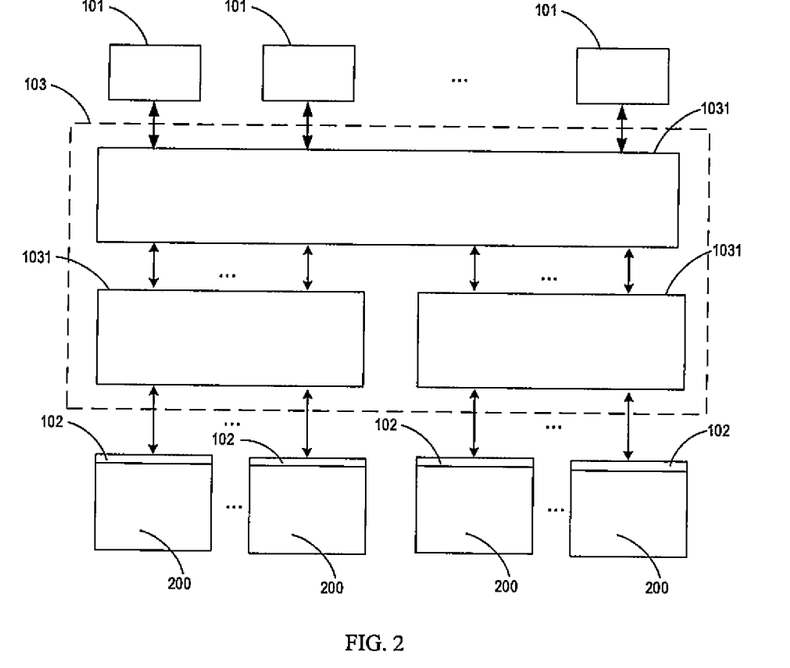
FIG. 2 is a schematic diagram illustrating performing data transmission by utilizing a multi-channel and layered memory interleaving technology according to some embodiments of the present disclosure.

FIG. 2 is a schematic diagram illustrating performing data transmission through a data transmission apparatus by utilizing a multi-channel and layered memory interleaving technology according to some embodiment of the present disclosure. As illustrated in FIG. 2, the data transmission apparatus includes a plurality of first ports 101, a plurality of second ports 102, and a plurality of data channels 103. The plurality of first ports 101 are coupled to a processing unit (such as a processing unit in the SoC). The plurality of second ports 102 are coupled to a plurality of memories 200. The plurality of data channels 103 are disposed among the first ports 101 and the second ports 102, and configured to transmit data among the processing unit and the plurality of memories 200.

The second ports 102 may be coupled to the plurality of memories through a memory controller and a physical layer. The number of the first ports 101 may or may not be equal to the number of the second ports 102. Generally, a total bandwidth provided by the plurality of first ports 101 is greater than or equal to a total bandwidth provided by the plurality of second ports 102. For example, in some embodiments, with the same bit width, the number of the first ports 101 may not be equal to the number of the second ports 102. An improvement according to embodiments of the present disclosure may be described below by taking the number of first ports 101 is equal to the number of second ports 102 as an example (e.g., an N×N crossbar).

Different from conventional data channels using a memory interleaving technology, the plurality of data channels according to embodiments of the present disclosure employ a layered memory interleaving mode. Each layer in the interleaving network of the data channels includes at least one interleaving sub-network 1031. That is, a layered interleaving network employed by the plurality of data channels, for example, as illustrated in FIG. 2, the plurality of data channels are divided into two layers, in which, there is one interleaving sub-network at a first layer and two interleaving sub-networks at a second layer.

Under this condition, the interleaving sub-network at the first layer needs to employ an N×2 crossbar for interleaving, while each interleaving sub-network in the second layer needs to employ a (N/2)×(N/2) crossbar for interleaving. It is obvious that hardware overhead may be less by employing the multi-channel and layered memory interleaving technology. In detail, a single-layer interleaving network employing the N×N crossbar may have more hardware overhead than an interleaving network employing a N×2+2×(N/2)×(N/2) crossbar in an example illustrated in FIG. 2. Since at least one layer in the interleaving network is scattered and rearranged, i.e. divided into a plurality of interleaving sub-networks, the number of long-path data channels may be greatly reduced, which is advantageous to a power consumption, a data transmission delay and a stability.

Figure 3:
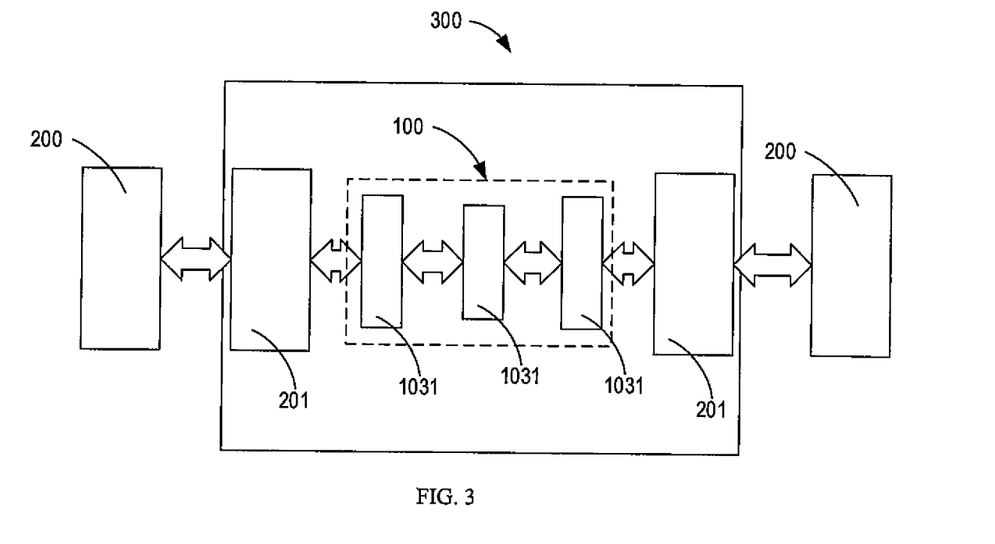
FIG. 3 is a schematic diagram illustrating a physical implementation by utilizing a multi-channel and layered memory interleaving technology according to some embodiments of the present disclosure.

Using the layered memory interleaving technology, each layer may form a new module alone or together with other existing module to form a new module, such that each interleaving sub-network does not occupy too much area and may be arranged flexibly. As illustrated in FIG. 3, the data transmission technology of the layered interleaving network illustrated in FIG. 2 may implement a layout of the symmetrical structure more easily.

In some embodiments, in a physical implementation, the second layer in the example of FIG. 2, the required memory controller, and the physical layer may be merged into an AI operation module for implementing. In this way, the module division and symmetrical structure may be better implemented, such that the layered memory interleaving technology has good expansibility. For example, with reasonable module division and symmetrical structure, the data channels may be easily expanded from 8 channels to 16 channels or even 32 or more channels, such that a high requirement for the bandwidth accessing the memory may be implemented more easily.

In some embodiments, interleaving sub-networks of at least adjacent layers in the plurality of layers of the interleaving network may be interconnected by employing interleaving data channels. A bus transmission protocol such as AXI interface may be employed among respective adjacent layers to transmit data. In this way, the data transmission efficiency and expansibility may further be improved.

In addition, FIG. 2 is a schematic diagram illustrating performing data transmission by utilizing a multi-channel and layered memory interleaving technology according to some embodiments of the present disclosure. It should be understood that, FIG. 2 is merely exemplary and is not intended to limit the protection scope of the present disclosure. The data transmission apparatus employing the layered memory interleaving according to embodiments of the present disclosure supports more flexible adjustment for each module and/or interleaving sub-network.

Figure 4:
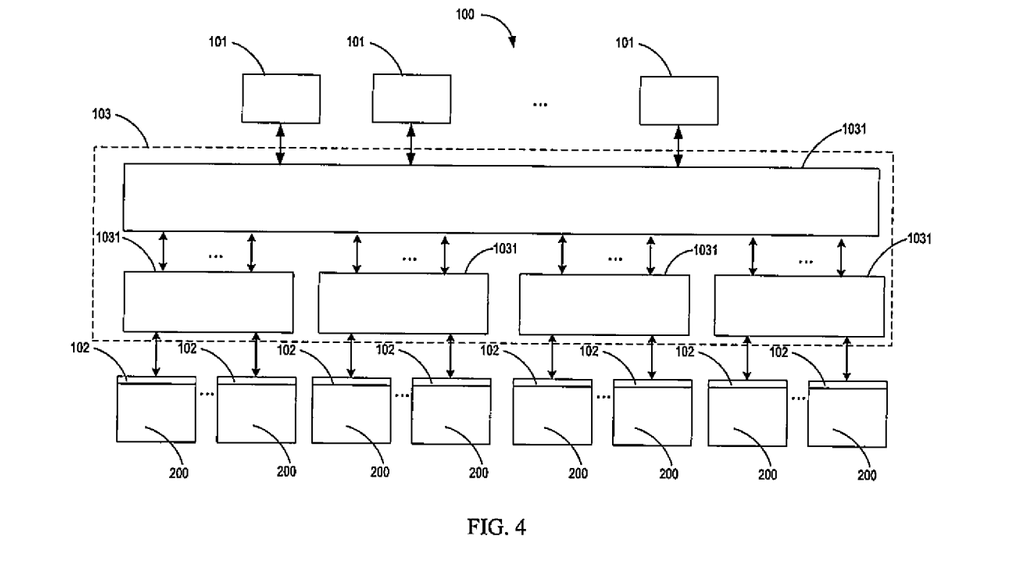
FIG. 4 is a schematic diagram illustrating performing data transmission by utilizing a multi-channel and layered memory interleaving technology according to some embodiments of the present disclosure.

For example, as illustrated in FIG. 4, in some embodiments, the plurality of data channels 103 also form an interleaving network having two layers. Different from the embodiment illustrated in FIG. 2, there may be one interleaving sub-network 1031 at a first layer of the interleaving network, and there may be four interleaving sub-networks at a second layer of the interleaving network. In this way, the interleaving sub-network at the first layer may employ a N×4 crossbar for interleaving, and each interleaving sub-network at the second layer may employ a (N/4)×(N/4) crossbar for interleaving, such that the hardware overhead may be further reduced, and various module division modes may also be supported. In addition, such arrangement also allows the memory to be symmetrically arranged around the SoC.

FIG. 2 and FIG. 4 illustrate a condition that the data channels may be divided into two layers of the interleaving networks. It may be seen by describing embodiments in FIG. 2 and FIG. 4 that, the number of interleaving sub-networks at each layer may be adjusted flexibly based on an actual requirement. In some embodiments, the number of interleaving sub-networks at the plurality of layers may gradually increase or decrease from the first ports 102 to the second ports. The expansibility and flexibility of data transmission are further improved by using a plurality of combinations of interleaving sub-networks among the plurality of layers.

Figure 5:
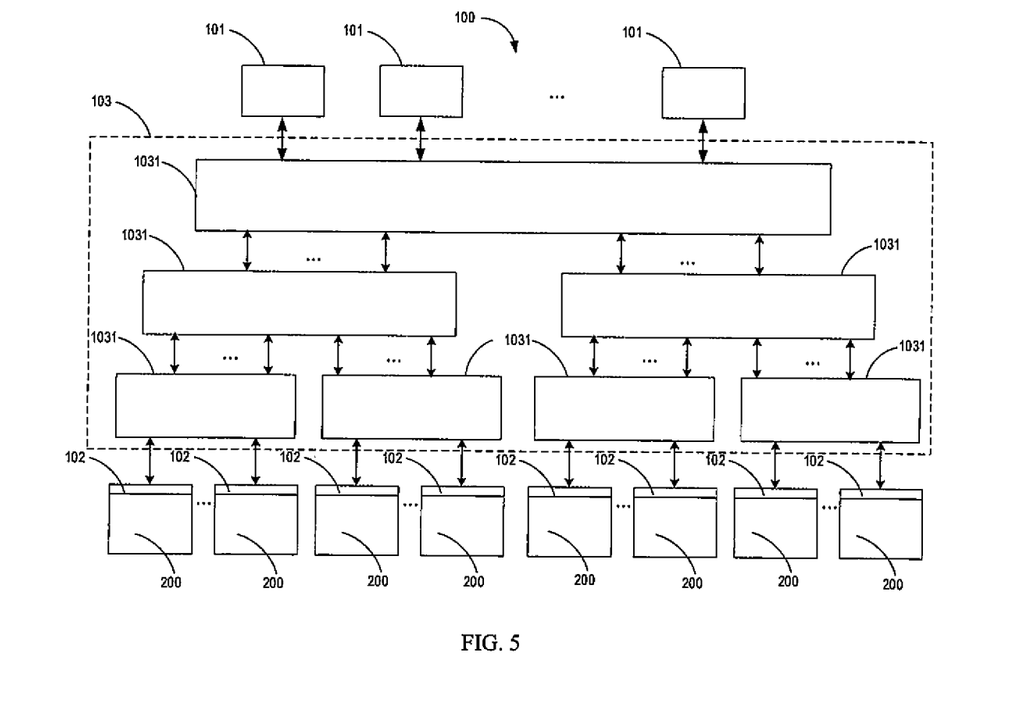
FIG. 5 is a schematic diagram illustrating performing data transmission by utilizing a multi-channel and layered memory interleaving technology according to some embodiments of the present disclosure.

In the plurality of combinations of interleaving sub-networks, not only may the number of interleaving sub-networks at each layer be adjusted flexibly based on the actual requirement, but also the number of layers of the interleaving network may be adjusted, such as 3 or more layers. The more the number of data channels, the more layers may be considered. For example, in some embodiments, as illustrated in FIG. 5, a 16-channel interleaving network having three layers is illustrated. There may be one interleaving sub-network 1031 at a first layer, two interleaving sub-networks 1031 at a second layer, and four interleaving sub-networks 1031 at a third layer.

In this case, the interleaving sub-network 1031 at the first layer may employ a N×2 crossbar for interleaving, each interleaving sub-network at the second layer may employ a (N/2)×(N/4) crossbar for interleaving, and each interleaving sub-network at the third layer may employ a (N/4)×(N/4) crossbar for interleaving. With the multi-layer structure, since the interleaving sub-network is further subdivided, it is more convenient for the module division and the symmetrical arrangement, and the expansibility and the scalability are further improved.

In addition to that the number of layers described above and the number of interleaving sub-networks at each layer may be flexibly adjusted, in order to further optimize the area, either of the first ports 101 or the second ports 102 may reduce the number of ports by increasing a data bit width.

For example, in some embodiments, a bit width of the first ports 101 may be twice that of the second ports. In this way, the number of first ports 101 may be the half of the number of second ports 102. When the interleaving network having two layers is employed, on the one hand, the interleaving sub-network at the first layer may employ an interleaving mode utilizing a (N/2)×2 crossbar, which may greatly reduce an area and a routing of the first layer. On the other hand, the decrease in the routing leads to a friendlier physical implementation. For example, when the number of the data channels is 16, eight first ports 101 are required.

The interleaving network of the data channels described above may have two or more layers, and each layer may have a multi-channel interleaving mode for different numbers of interleaving sub-networks. The multi-channel interleaving method implements a plurality of arrangement modes for the data channels, and implements the multi-channel and layered memory interleaving method with the high expansibility and the good physical implementation.

Figure 6:
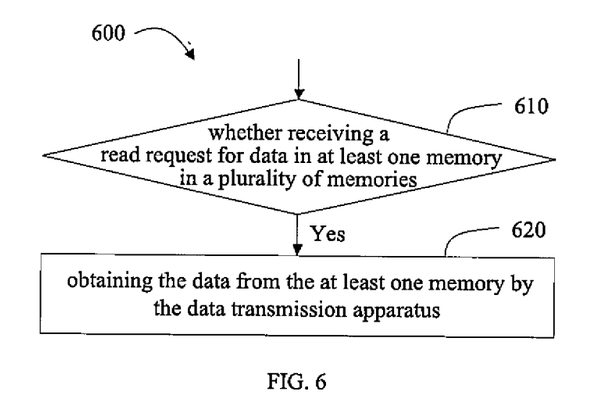
FIG. 6 is a flow chart illustrating a data processing method according to embodiments of the present disclosure.

According to embodiments of the present disclosure, there is further provided a data processing method 600. The data processing method 600 may be executed by the processing unit in the data processing system. FIG. 6 is a flow chart illustrating a data processing method according to embodiments of the present disclosure. As illustrated in FIG. 6, at block 610, it is determined whether a read request for data in at least one memory 200 in a plurality of memories 200 is received. When the read request is received, at block 620 in the method 600, the data is read from the at least one memory 200 by the data transmission apparatus described above.

For example, when a user wants to process data stored in a memory or other storage device, the user may send the read request for the data to the processing unit through an appropriate interface. When the data is stored in other storage devices, the data may be transferred to the memory via an appropriate operation. The read request may include an address of the data in the memory. The processing unit may obtain the data from the memory 200 according to the address upon receiving the read request for the data. The obtained data may be processed correspondingly and then sent to a module designated by the user through an interface for further processing. For example, the data may be written into the memory 200 for further processing after being read and processed by the processing unit.

Figure 7:
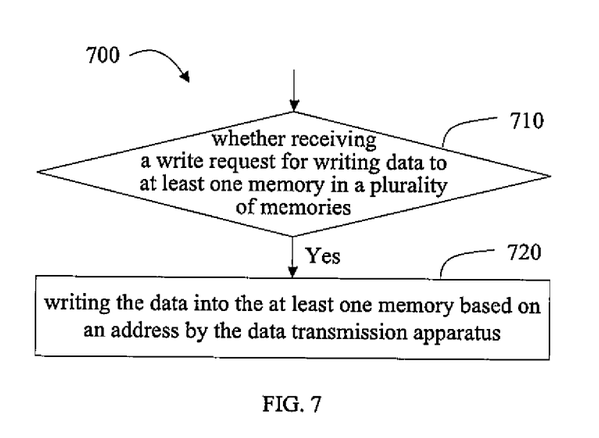
FIG. 7 is a flow chart illustrating a data processing method according to embodiments of the present disclosure.

According to embodiments of the present disclosure, there is further provided a data processing method 700. The data processing method 700 may be executed by the processing unit in the data processing system. FIG. 7 is a flow chart illustrating a data processing method according to embodiments of the present disclosure. As illustrated in FIG. 7, at block 710, it is determined whether a write request for writing data to at least one memory 200 in a plurality of memories is received. When the write request is received, at block 720 in the method 700, the data is written into the at least one memory by the data transmission apparatus described above.

For example, after the processing unit completes processing the data and receives a request for writing the processed data into the memory 200, the processing unit writes the data into the memory 200 via the data transmission apparatus described above for further processing.

With the method, by employing the multi-channel and layered memory interleaving technology, the number of long-path data channels may be effectively reduced, and the data transmission efficiency and the stability may be improved.

According to embodiments of the present disclosure, there is further provided a data processing system 300. As illustrated in FIG. 3, the data processing system may include a processing unit, a storage device, and a data transmission apparatus 100 described above. The data processing system 300 may be a SoC in some embodiments. The storage device is configured to store at least one program that may be executable by the processing unit. When the at least one program is executed by the processing unit, the processing unit is caused to implement the method described above. The data processing system 300 by employing the data transmission apparatus 100 described above has a more reasonable layout, a higher expansibility and a lower energy consumption.

In some embodiments, the data transmission apparatus 100 may be integrated in the processing unit. In other words, in some embodiments, the SoC includes at least one processing unit, and the data transmission apparatus 100 may be a data channel integrated in the processing unit of the SoC. In some embodiments, the plurality of memories 200 may be disposed at any position of the data processing system (e.g., the SoC), for example, symmetrically disposed on both sides or around. The data processing unit employing the above arrangement may be physically implemented more easily.

Figure 8:
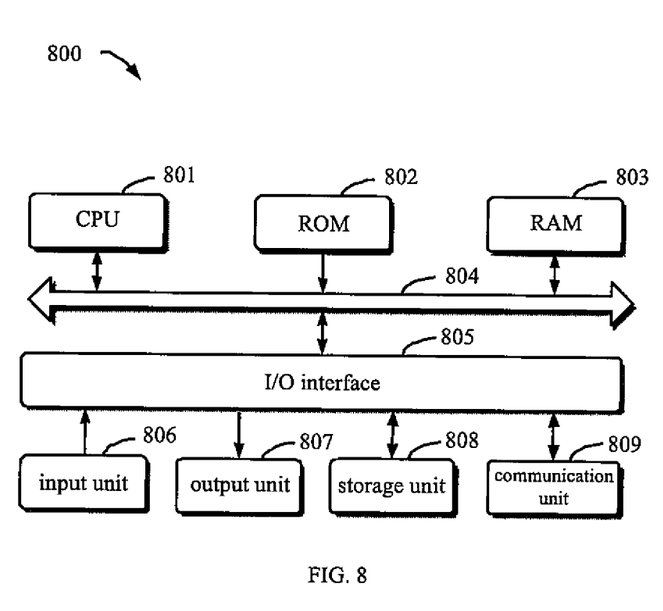
FIG. 8 is a block diagram illustrating a computing device capable of implementing a plurality of embodiments of the present disclosure.

FIG. 8 is a block diagram illustrating an exemplary device 600 for implementing embodiments of the present disclosure. The device 800 may be configured to implement the method illustrated in FIG. 6 and FIG. 7. As illustrated in FIG. 8, the device 800 includes a central processing unit (CPU) 801. The CPU 801 may execute various appropriate actions and processes according to computer program instructions stored in a read only memory (ROM) 802 or computer program instructions loaded to a random access memory (RAM) 803 from a storage unit 808. The RAM 803 may also store various programs and date required by the device 800. The CPU 801, the ROM 802, and the RAM 803 may be connected to each other via a bus 804. An input/output (I/O) interface 805 is also connected to the bus 804.

A plurality of components in the device 800 are connected to the I/O interface 805, including: an input unit 806 such as a keyboard, and a mouse; an output unit 807 such as various types of displays and loudspeakers; a storage unit 808 such as a magnetic disk, an optical disk; and a communication unit 809, such as a network card, a modem, a wireless communication transceiver. The communication unit 809 allows the device 800 to exchange information/data with other devices over a computer network such as the Internet and/or various telecommunication networks.

The CPU 801 executes the above-mentioned methods and processes, such as the method 600 and method 700. For example, in some implementations, the method 600 and method 700 may be implemented as a computer software program. The computer software program is tangibly contained a machine readable medium, such as the storage unit 808. In some embodiments, a part or all of the computer programs may be loaded and/or installed on the device 800 through the ROM 802 and/or the communication unit 809. When the computer programs are loaded to the RAM 803 and are executed by the CPU 801, one or more blocks of the method 600 and method 700 described above may be executed. Alternatively, in other embodiments, the CPU 801 may be configured to execute the method 600 and method 700 in other appropriate ways (such as, by means of hardware).

The functions described herein may be executed at least partially by one or more hardware logic components. For example, without not limitation, exemplary types of hardware logic components that may be used include: a field programmable gate array (FPGA), an application specific integrated circuit (ASIC), an application specific standard product (ASSP), a system on chip (SOC), a complex programmable logic device (CPLD) and the like.

Program codes for implementing the method of the present disclosure may be written in any combination of one or more programming languages. These program codes may be provided to a processor or a controller of a general purpose computer, a special purpose computer or other programmable data processing device, such that the functions/operations specified in the flowcharts and/or the block diagrams are implemented when these program codes are executed by the processor or the controller. These program codes may execute entirely on a machine, partly on a machine, partially on the machine as a stand-alone software package and partially on a remote machine, or entirely on a remote machine or entirely on a server.

In the context of the present disclosure, the machine-readable medium may be a tangible medium that may contain or store a program to be used by or in connection with an instruction execution system, apparatus, or device. The machine-readable medium may be a machine-readable signal medium or a machine-readable storage medium. The machine-readable medium may include, but not limit to, an electronic, magnetic, optical, electromagnetic, infrared, or semiconductor system, apparatus, or device, or any suitable combination of the foregoing. More specific examples of the machine-readable storage medium may include electrical connections based on one or more wires, a portable computer disk, a hard disk, a RAM, a ROM, an erasable programmable read-only memory (EPROM or flash memory), an optical fiber, a portable compact disk read-only memory (CD-ROM), an optical storage, a magnetic storage device, or any suitable combination of the foregoing.

In addition, although the operations are depicted in a particular order, it should be understood to require that such operations are executed in the particular order illustrated in the accompanying drawings or in a sequential order, or that all illustrated operations should be executed to achieve the desired result. Multitasking and parallel processing may be advantageous in certain circumstances. Likewise, although several specific implementation details are included in the above discussion, these should not be construed as limitation of the scope of the present disclosure. Certain features described in the context of separate embodiments may also be implemented in combination in a single implementation. On the contrary, various features described in the context of the single implementation may also be implemented in a plurality of implementations, either individually or in any suitable sub-combination.

It should be understood that, the above detailed embodiments of the present disclosure are merely to illustrate or explain the principle of the present disclosure, and are not intended to limit the present disclosure. Therefore, any modification, equivalent substitution and improvement made within the spirit and principle of the present disclosure shall be included within the scope protection of the present disclosure. Meanwhile, the claims appended to the present disclosure are intended to cover all changes and modifications that are equivalent to the scope and bounds of the claims and fall within the scope and bounds of the claims.

What is claimed is:

1. A data transmission apparatus (100), comprising:
a plurality of first ports (101), coupled to a processing unit;
a plurality of second ports (102), coupled to a plurality of memories (200); and
a plurality of data channels (103), disposed among the first ports (101) and the second ports (102) to form an interleaving network having a plurality of layers, and configured to transmit data among the processing unit and the plurality of memories (200), wherein the plurality of layers are hierarchically connected, one of two ends of the plurality of layers hierarchically connected is connected to the plurality of first ports (101), another of two ends of the plurality of layers hierarchically connected is connected to the plurality of plurality of second ports (102), each layer comprises at least one interleaving sub-network (1031), and a number of a plurality of interleaving sub-networks (1031) in each of the plurality of layers of the interleaving network increases or decreases from the first ports (101) to the second ports (102).

2. The data transmission apparatus (100) of claim 1, wherein the plurality of data channels (103) comprise interleaving data channels, such that adjacent layers in the plurality of layers of the interleaving network couple with each other.

3. The data transmission apparatus (100) of claim 1, wherein a first total bandwidth provided by the plurality of first ports (101) is greater than or equal to a second total bandwidth provided by the plurality of second ports (102).

4. The data transmission apparatus (100) of claim 1, wherein the plurality of second ports (102) are coupled to the plurality of memories (200) through a memory controller (201).

5. A data processing method, comprising:
in response to receiving a read request for data in at least one memory (200) in a plurality of memories (200), obtaining the data from the at least one memory (200) by a data transmission apparatus (100), wherein the data transmission apparatus (100), comprises: a plurality of first ports (101), coupled to a processing unit; a plurality of second ports (102), coupled to a plurality of memories (200); and a plurality of data channels (103), disposed among the first ports (101) and the second ports (102) to form an interleaving network having a plurality of layers, and configured to transmit data among the processing unit and the plurality of memories (200), wherein, the plurality of layers are hierarchically connected, one of two ends of the plurality of layers hierarchically connected is connected to the plurality of first ports (101), another of two ends of the plurality of layers hierarchically connected is connected to the plurality of plurality of second ports (102), each layer comprises at least one interleaving sub-network (1031), and a number of a plurality of interleaving sub-networks (1031) in each of the plurality of layers of the interleaving network increases or decreases from the first ports (101) to the second ports (102).

6. The data processing method of claim 5, further comprising:
in response to receiving a write request for writing data to the at least one memory (200) in the plurality of memories (200), writing the data into the at least one memory (200) by the data transmission apparatus (100).

7. A data processing system (300), comprising:
a processing unit;
a data transmission apparatus (100), comprising:
a plurality of first ports (101), coupled to the processing unit,
a plurality of second ports (102), coupled to a plurality of memories (200), and
a plurality of data channels (103), disposed among the first ports (101) and the second ports (102) to form an interleaving network having a plurality of layers, and configured to transmit data among the processing unit and the plurality of memories (200), wherein the plurality of layers are hierarchically connected, one of two ends of the plurality of layers hierarchically connected is connected to the plurality of first ports (101), another of two ends of the plurality of layers hierarchically connected is connected to the plurality of plurality of second ports (102), each layer comprises at least one interleaving sub-network (1031), and a number of a plurality of interleaving sub-networks (1031) in each of the plurality of layers of the interleaving network increases or decreases from the first ports (101) to the second ports (102); and
a storage device, comprising the plurality of memories (200).

8. The data processing system (300) of claim 7,
wherein the storage device is configured to store one or more programs,
wherein when the one or more programs are executed by the processing unit, the processing unit is caused to implement the method,
the method comprising: in response to receiving a read request for data in at least one memory (200) in a plurality of memories (200), obtaining the data from the at least one memory (200) by a data transmission apparatus (100), and in response to receiving a write request for writing data to at least one memory (200) in a plurality of memories (200), writing the data into the at least one memory (200) by the data transmission apparatus (100).

9. The data processing system (300) of claim 7, wherein the data transmission apparatus (100) is integrated in the processing unit.

10. The data processing system (300) of claim 7, wherein the plurality of memories (200) are disposed at any position around the data processing system.

11. The data processing system (300) of claim 7, wherein the plurality of data channels (103) comprise interleaving data channels, such that adjacent layers in the plurality of layers of the interleaving network couple with each other.

12. The data processing system (300) of claim 7, wherein a number of a plurality of interleaving sub-network (1031) in the plurality of layers of the interleaving network increases or decreases from the first ports (101) to the second ports (102).

13. The data processing system (300) of claim 7, wherein a first total bandwidth provided by the plurality of first ports (101) is greater than or equal to a second total bandwidth provided by the plurality of second ports (102).

14. The data processing system (300) of claim 7, wherein the plurality of second ports (102) are coupled to the plurality of memories (200) through a memory controller (201).

15. The data transmission apparatus (100) of claim 1, wherein the number of the plurality of interleaving sub-networks (1031) in each of the plurality of layers of the interleaving network increases from the first ports (101) to the second ports (102).

16. The data transmission apparatus (100) of claim 1, wherein the number of the plurality of interleaving sub-networks (1031) in each of the plurality of layers of the interleaving network decreases from the first ports (101) to the second ports (102).

17. The data transmission method of claim 5, wherein the number of the plurality of interleaving sub-networks (1031) in each of the plurality of layers of the interleaving network decreases from the first ports (101) to the second ports (102).

18. The data transmission method of claim 5, wherein the number of the plurality of interleaving sub-networks (1031) in each of the plurality of layers of the interleaving network increases from the first ports (101) to the second ports (102).

19. The data transmission system (300) of claim 7, wherein the number of the plurality of interleaving sub-networks (1031) in each of the plurality of layers of the interleaving network increases from the first ports (101) to the second ports (102).

20. The data transmission system (300) of claim 7, wherein the number of the plurality of interleaving sub-networks (1031) in each of the plurality of layers of the interleaving network decreases from the first ports (101) to the second ports (102).

\* \* \* \* \*